(12) United States Patent
Murphy et al.

(10) Patent No.: US 6,643,952 B2
(45) Date of Patent: Nov. 11, 2003

(54) SYSTEM AND METHOD FOR CONTROLLING A VAPOR DRYER PROCESS

(75) Inventors: Neal T. Murphy, Richardson, TX (US); Claire Ching-Shan Jung, Plano, TX (US); Daryl R. Koehl, Garland, TX (US); Donald J. Rigsby, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/285,898

(22) Filed: Nov. 1, 2002

(65) Prior Publication Data

US 2003/0056389 A1 Mar. 27, 2003

Related U.S. Application Data

(62) Division of application No. 09/737,632, filed on Dec. 14, 2000, now Pat. No. 6,497,055.
(60) Provisional application No. 60/174,321, filed on Jan. 4, 2000.

(51) Int. Cl.⁷ .................................................. F26B 3/00
(52) U.S. Cl. ..................... 34/445; 446/486; 446/491; 134/10; 134/25.4; 134/902
(58) Field of Search .......................... 34/445, 446, 467, 34/486, 491; 134/10, 25.4, 902

(56) References Cited

U.S. PATENT DOCUMENTS

| | | | |
|---|---|---|---|
| 4,777,970 A | * 10/1988 | Kusuhara | 134/66 |
| 4,841,645 A | 6/1989 | Bettcher et al. | 34/78 |
| 5,054,210 A | * 10/1991 | Schumacher et al. | 34/78 |
| 5,371,950 A | 12/1994 | Schumacher | 34/78 |
| 5,448,906 A | * 9/1995 | Cheung | 73/31.06 |
| 5,940,985 A | 8/1999 | Kamikawa et al. | 34/471 |
| 6,027,574 A | 2/2000 | Fishkin et al. | 134/30 |
| 6,027,760 A | * 2/2000 | Gurer et al. | 427/8 |
| 6,122,837 A | 9/2000 | Olesen et al. | 34/315 |
| 6,146,468 A | 11/2000 | Dryer et al. | 134/10 |
| 6,244,280 B1 | 6/2001 | Dryer et al. | 134/100.1 |
| 6,284,055 B1 | 9/2001 | Dryer et al. | 134/10 |
| 6,286,524 B1 | 9/2001 | Okuchi et al. | 134/95.2 |
| 6,328,809 B1 | 12/2001 | Elsawy et al. | 134/3 |

* cited by examiner

Primary Examiner—Ira S. Lazarus
Assistant Examiner—Kathryn S. O'Malley
(74) Attorney, Agent, or Firm—Yingsheng Tung; Wade James Brady, III; Frederick J. Telecky, Jr.

(57) ABSTRACT

A system and method are disclosed including a vapor dryer chamber (12) with a lid (14). A heater (16) is disposed within the vapor dryer chamber to vaporize liquid drying medium (24), preferably isopropyl alcohol, in the bottom of the vapor dryer chamber (12). Cooling coils (18) disposed within an upper portion of the vapor drying chamber (12) condense the drying medium vapor. A vapor monitor assembly (30) is disposed within the vapor dryer chamber (12) to monitor the vapor concentration within vapor dryer chamber (12). A controller (40) is associated with the vapor monitor assembly (30) and evaluates vapor concentration measurements from the vapor monitor (38).

8 Claims, 1 Drawing Sheet

SYSTEM AND METHOD FOR CONTROLLING A VAPOR DRYER PROCESS

This is a divisional application of Ser. No. 09/737,632, now U.S. Pat. No. 6,497,055, filed Dec. 14, 2000, which claims priority under 35 USC 119(e)(1) of provisional application Ser. No. 60/174,321, filed Jan. 4, 2000.

TECHNICAL FIELD OF THE INVENTION

This invention relates in general to the field of electronic devices. More specifically, the invention relates to a system and method for controlling vapor dryer processing which is used in the fabrication of semiconductor devices.

BACKGROUND OF THE INVENTION

Vapor dryers are often used in semiconductor fabrication processing. Typically, a boat loaded with semiconductor substrate wafers is placed into a vapor dryer chamber. Heaters along the bottom and/or sides of the vapor dryer chamber heat a drying medium, typically isopropyl alcohol (IPA), to create a vapor cloud of drying medium within the chamber. Cooling coils within an upper portion of the vapor dryer chamber are typically provided to condense the drying medium vapor. When the vapor dryer chamber reaches an equilibrium or steady state, the vapor cloud develops an upper boundary within the vapor dryer chamber known as a vapor blanket.

The boat and semiconductor substrate wafers preferably rest in the chamber beneath the vapor blanket. The drying medium acts to displace water or other fluid associated with the semiconductor substrate wafers. If water is not displaced from the semiconductor substrate wafers, water can inhibit the effectiveness of subsequent fabrication processes. For example, if not removed, water may etch a silicon wafer. Water may also collect and leave behind a deposit when it eventually evaporates. The deposit often creates a defect. Water may react with the substrate material such that deposited material fails to properly adhere to the substrate. These types of defects are often referred to as watermarks.

A variety of factors can disrupt the effectiveness of the vapor drying process. Often, before a boat and semiconductor substrate wafers are placed into the vapor dryer chamber, the chamber has reached an equilibrium or steady state and developed a vapor blanket at a desired height within the vapor dryer chamber. When the lid of the vapor dryer chamber is opened, the vapor cloud is disturbed and the vapor blanket no longer rests at the desired height within the vapor dryer chamber. The vapor cloud may only partially cover the semiconductor substrate wafers such that the vapor cloud interacts with only a portion of the wafers. Eventually the vapor dryer chamber may return to its initial equilibrium or steady state with the vapor blanket resting at the desired height within the vapor dryer chamber. However, a portion of the substrates may not be properly processed because of the disruption of the vapor blanket.

Other factors can effect vapor dryer processing. The number of disks within the chamber can effect the time it takes for the chamber to return to its equilibrium state. The heater or cooling coils may malfunction such that the vapor cloud does not develop properly. An adequate amount of drying medium may not be available to process the substrate wafers. Also, an exhaust system associate with the vapor dryer chamber may malfunction, disrupting vapor dryer processing.

Often vapor drying processes are timed. After being processed within the vapor dryer chamber for a desired amount of time, the boat and substrate wafers are removed. One problem with using a set time is that the wafers may not be properly processed if the chamber does not return to its equilibrium state as quickly as expected. Also, if the heater or cooling coils are malfunctioning, the substrate wafers may not be processed properly. Because it often takes days or weeks to discover a watermark and its source, improper processing can waste valuable time and resources.

Set times are typically conservative, often resulting in the substrate wafers remaining within the vapor dryer chamber for a longer period than is necessary for optimum processing. This practice consumes valuable process time within the chamber that could be used to process other semiconductor substrate wafers.

SUMMARY OF THE INVENTION

In accordance with teachings of the present disclosure, a system and method are provided for controlling vapor dryer processing that substantially eliminates or reduce disadvantages and problems associated with prior systems and methods for operating a vapor dryer. The vapor dryer system preferably includes a vapor dryer chamber with a lid. A heater may be disposed within the vapor dryer chamber to heat a selected liquid drying medium, such as IPA, in the bottom of the vapor dryer chamber. Cooling coils may be disposed within an upper portion of the vapor drying chamber condense drying medium vapor. A vapor monitor is preferably disposed within the vapor dryer chamber to monitor the vapor concentration at a desired position. A controller is preferably associated with the vapor monitor and evaluates vapor concentration measurements from the vapor monitor.

In one aspect of the present invention, a vapor dryer system for use in semiconductor fabrication includes a vapor dryer chamber and at least one heater disposed within the vapor dryer chamber. The heater creates a drying medium vapor by heating a liquid form of drying medium within the vapor dryer chamber. At least one cooling coil is preferably disposed within the vapor dryer chamber to condense the drying medium vapor. A vapor monitor may be disposed within the vapor dryer chamber to measure vapor concentration within the vapor dryer chamber. The vapor monitor is preferably connected to a controller that evaluates vapor concentration measurements from the vapor monitor. More specifically, the vapor monitor may be an isopropyl alcohol vapor concentration monitor.

In another aspect of the present invention, the drying medium vapor forms a vapor cloud having a desired steady state blanket level within the vapor dryer chamber. The vapor monitor is preferably positioned to measure the drying medium vapor concentration at the desired steady state blanket level.

In another aspect of the present invention, a vapor dryer control system is disclosed for use in semiconductor fabrication. The vapor dryer control system includes a vapor monitor to measure vapor concentration in a vapor dryer chamber and a controller associated with the vapor monitor to evaluate vapor concentration measurements from the vapor monitor. More specifically, the controller may determine a vapor dryer process cycle end point. More specifically, the controller may detect and note a vapor dryer process excursion.

In yet another aspect of the present invention a method for monitoring a vapor drying process includes providing a vapor monitor in a vapor dryer chamber. The vapor monitor then measures vapor concentration at a selected level of the vapor dryer chamber. The vapor concentration measurements are recorded and used to control the vapor drying process. More specifically, measuring vapor concentration may include measuring the vapor concentration of isopropyl alcohol within the vapor dryer chamber.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Figure 1:
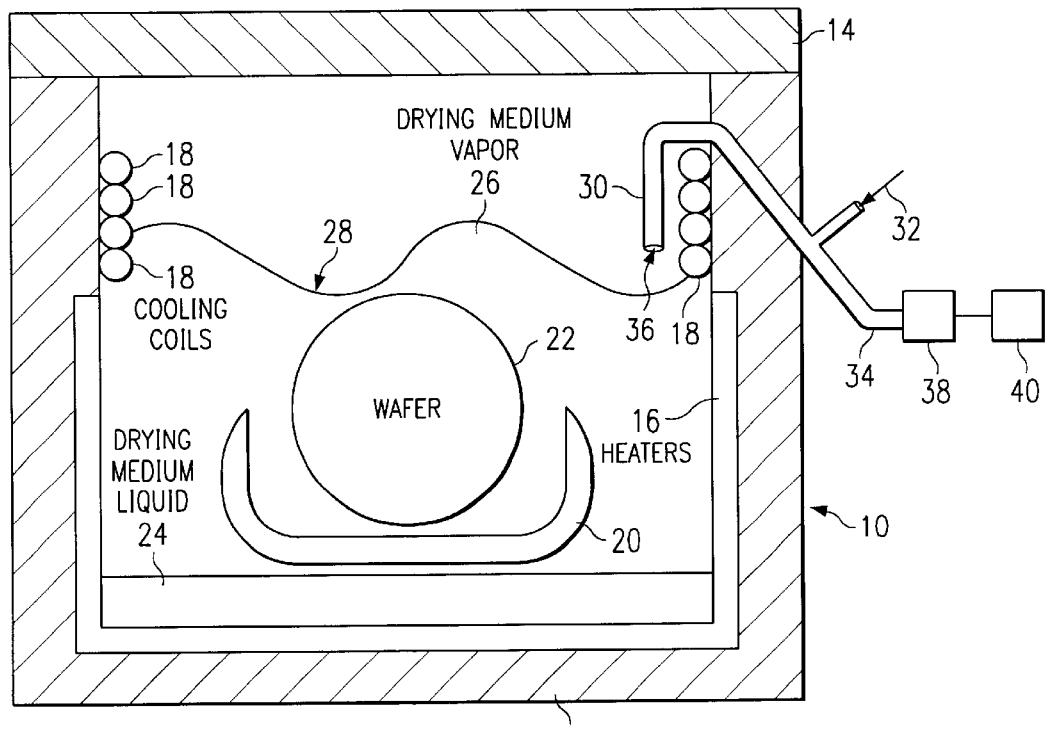
FIG. 1 is a schematic drawing in section with a portion broken away of a vapor dryer system incorporating teachings of the present invention.

FIG. 1 is a schematic diagram of vapor dryer system 10 incorporating teachings of the present invention. Vapor dryer system 10 includes vapor drying chamber 12 for processing semiconductor substrate wafers 22. Lid 14 is preferably pivotally coupled (not expressly shown) to vapor dryer chamber 12 such that lid 14 allows access to the interior of vapor dryer chamber 12. Heater 16 is disposed within a bottom portion of vapor dryer chamber 12. Cooling coils 18 are disposed within an upper portion of vapor drying chamber 12. Heater 16 is preferably connected to an exterior power source (not expressly shown) operable to supply power to heater 16. Cooling coils 18 are preferably connected to an exterior cooling source (not expressly shown) operable to communicate cooling fluid into cooling coils 18.

Drying medium 24 in liquid form collects in the bottom of vapor dryer-chamber 12. Drying medium 24 is preferably isopropyl alcohol (IPA). Alternatively, drying medium 24 may comprise another process fluid suitable for the desired vapor dryer processing.

The present embodiment shows vapor drying chamber 12 operable to process a single boat 20 of substrate wafers 22. Alternatively, vapor dryer chamber 12 may be sized to process a plurality of boats 20, each holding a plurality of substrate wafers 22.

Heater 16 heats drying medium 24, preferably producing drying medium vapor 26. As drying medium vapor 26 rises within vapor dryer chamber 12, cooling coils 18 act to condense drying medium vapor 26. Condensed drying medium preferably travels down the interior walls of the vapor dryer chamber 12, collecting in the pool of drying medium 24 at the bottom of vapor dryer chamber 12. The interaction between heater 16 vaporizing liquid drying medium 24 and cooling coils 18 condensing drying medium vapor preferably produces a cloud of drying medium vapor 26. This cloud of drying medium vapor 26 preferably has a vapor blanket 28 within vapor dryer chamber 12. Vapor blanket 28 represents the upper boundary of drying medium vapor cloud 26. When vapor dryer chamber 12 reaches a steady state, vapor blanket 28 is preferably above boat 20 and wafers 22.

Vapor dryer chamber 12 is preferably sized for processing boat 20 holding wafers 22. Boat 20 may be loaded manually or by suitable automated transfer equipment. Vapor dryer chamber 12 may include one or more exhaust conduits (not expressly shown) for regulating the vapor dryer chamber 12 environment.

Vapor concentration monitor assembly 30 preferably includes monitor inlet 36 in fluid communication with monitor outlet 34. Monitor 38 is preferably in fluid communication with monitor outlet 34. Controller 40 is preferably in electrical communication with monitor 38. Dilution supply 32 is in fluid communication with monitor inlet 36 and monitor outlet 34.

Dilution supply 32 may be in fluid communication with a dilution system (not expressly shown) for introducing a dilution fluid, such as nitrogen or another inert gas, to dilute fluid entering monitor inlet 36. Dilution supply 32 may be operable to selectively dilute fluid flow from vapor dryer chamber 12 to prevent saturating monitor 38.

Monitor 38 is operable to determine the vapor concentration of vapor traveling through monitor outlet 34. For one application monitor 38 may determine the IPA vapor concentration of the vapor traveling through monitor outlet 34. For one application monitor 38 may be a vapor concentration monitor, such as IPA vapor concentration monitor model SD-703RI-AS sold by RKI instruments. Controller 40 is in electrical communication with monitor 38 and preferably records vapor concentration data determined by monitor 38.

Vapor concentration monitor 30 is preferably positioned within vapor dryer chamber 30 such that monitor inlet 36 is operable to determine the vapor concentration at a desired vapor blanket level 28. Vapor concentration monitor 30 may by selectively positionable within vapor dryer chamber 12 to allow for the selective monitoring of different areas of vapor dryer chamber 12.

Figure 2:
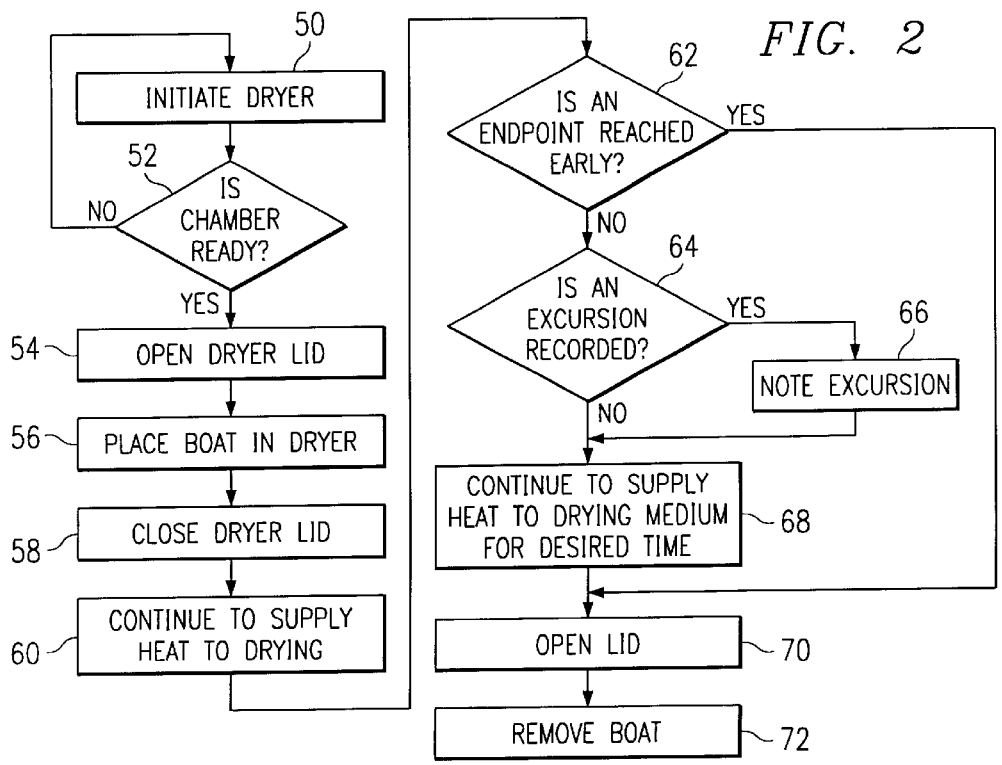
FIG. 2 is a flow diagram of a method for controlling a vapor dryer process incorporating teachings of the present invention.

FIG. 2 is a flow diagram showing a method for controlling a vapor drying process incorporating teachings of the present invention. The method begins with initiating the vapor dryer 50. This step involves heating liquid drying medium 24 within vapor dryer chamber 12 while condensing drying medium vapor until a desired steady state has been reached. The desired steady state is reached when a cloud of vapor having an upper boundary at the desired height within the vapor dryer is formed and maintained. Next, controller 40 may determine whether vapor chamber 12 is ready to begin processing 52 using vapor concentration data from monitor 38. If vapor dryer chamber 12 is not properly initiated and ready for processing, the initiation step 50 is repeated. If vapor dryer chamber 12 is ready for processing, the vapor dryer lid 14 is opened 54.

After lid 14 is opened 54, boat 20 and wafers 22 are placed in the dryer 56. The dryer lid 14 is then closed 58. Heater 16 continues to supply heat to the drying medium 60 and the cooling coils 18 continue to condense the drying medium vapor. Vapor concentration monitor 30 measures the concentration of the drying medium vapor within vapor dryer chamber 12. In one embodiment, vapor concentration monitor 30 measures a diluted vapor concentration to prevent the saturation of monitor 30. Controller 40 monitors the drying cycle by evaluating measurement of vapor concentration received from monitor 38.

Controller 40 determines whether an end point to the vapor process cycle has been reached before a predetermined cycle end point. Often, determining whether an end point has been reached includes evaluating the vapor concentration measured by monitor 38 to determine whether the vapor dryer chamber 12 has maintained the desired vapor concentration for a desired length of time 62. If an end point has been reached early, the lid 14 of the vapor dryer chamber 12 may be opened 70 and boat may be removed 72.

If an end point is not reached early, controller 40 preferably determines whether an excursion within the process cycle is recorded 64. The excursion may be any significant variation in vapor concentration measured by the vapor concentration monitor 30 during vapor dryer processing. If an excursion is recorded, the excursion is preferably noted 66 by controller 40. The excursion may also be a determination that an end point was not reached during a predetermined length of time. The excursion may be noted by flagging the data representing the excursion and saving the data. The data may be saved on a computer readable medium. Noting the excursion may further include indicating the excursion to operators by operating a visual or audible alarm. If an excursion is detected, the time that wafers 22 are processed in chamber 12 may be extended by a set amount of time or until the excursion event has passed.

If no excursion is recorded, the drying process is preferably continued for a desired length of time 68. After such time the lid of the vapor dryer chamber may be opened 70 and boat may be removed 72 from vapor dryer chamber 12.

In an alternative embodiment, controller 40 may continuously evaluate the dryer process cycle to determine whether an end point has been reached. In another alternative embodiment, controller 40 may periodically evaluate the dryer process cycle to determine whether an end point has been reached. In yet another alternative embodiment, the controller may be further operable to continuously or periodically evaluate whether an excursion has been recorded.

While the disclosed embodiments have been described in detail, it should be understood that various changes, substitutions and alternations can be made to the embodiments without departing from their spirit and scope.

What is claimed is:

1. A method for monitoring a vapor drying process during semiconductor fabrication comprising:

providing a vapor monitor in a vapor dryer chamber;

measuring vapor concentration at a selected level of the vapor dryer chamber;

recording the vapor concentration measurement; and controlling the vapor drying process using the vapor concentration measurement.

2. The method of claim 1 wherein measuring vapor concentration further comprises measuring an isopropyl alcohol vapor concentration within the vapor dryer chamber.

3. The method of claim 1 further comprising:

initiating the vapor dryer chamber;

placing at least one substrate wafer in the vapor dryer chamber;

determining whether the vapor drying process reaches an end point; and removing the at least one substrate wafer when an end point has been reached.

4. The method of claim 1 further comprising:

initiating the vapor dryer chamber;

determining an initial steady state point using the vapor concentration measurement; and placing at least one substrate wafer in the vapor dryer chamber after the initial steady state point.

5. The method of claim 1 wherein controlling the process further comprises:

determining whether the vapor drying process experiences a process excursion; and flagging the vapor concentration measurement that represents the process excursion.

6. The method of claim 1 wherein the selected level comprises a vapor cloud steady state blanket level.

7. The method of claim 1 wherein controlling the process further comprises:

detecting a process excursion; and extending the vapor drying process for a set period of time.

8. The method of claim 1 wherein controlling the process further comprises:

detecting a process excursion; and extending the vapor drying process until the process excursion has passed.

* * * * *